(12) United States Patent  
Chen

(10) Patent No.: US 8,535,955 B2
(45) Date of Patent: *Sep. 17, 2013

(54) METHOD FOR ASSEMBLING A MULTI-COMPONENT ELECTRONIC APPARATUS

(75) Inventor: Kong-Chen Chen, San Jose, CA (US)

(73) Assignee: Wintec Industries, Inc., Milpitas, CA (US)

( * ) Notice: Subject to any disclaimer, the term of this patent is extended or adjusted under 35 U.S.C. 154(b) by 570 days.

This patent is subject to a terminal disclaimer.

(21) Appl. No.: 12/779,049

(22) Filed: May 13, 2010

(65) Prior Publication Data

US 2011/0121293 A1 May 26, 2011

Related U.S. Application Data

(63) Continuation of application No. 11/351,418, filed on Feb. 10, 2006, now Pat. No. 7,928,591.

(60) Provisional application No. 60/652,217, filed on Feb. 11, 2005.

(51) Int. Cl.
*H01L 21/26* (2006.01)

(52) U.S. Cl.
USPC ............................. 438/14; 257/E23.179

(58) Field of Classification Search
USPC ............ 438/14, 15, 259, 261, 975; 257/797, 257/E23.179
See application file for complete search history.

(56) References Cited

U.S. PATENT DOCUMENTS

| | | |
|---|---|---|
| 4,833,621 A | 5/1989 | Umatate |
| 5,194,695 A | 3/1993 | Maslakow |
| 5,302,854 A | 4/1994 | Nishiguchi et al. |
| 5,477,009 A | 12/1995 | Brendecke et al. |
| 5,489,749 A | 2/1996 | DiStefano et al. |
| 5,661,042 A | 8/1997 | Fang et al. |
| 6,057,700 A | 5/2000 | Crispell |
| 6,081,040 A | 6/2000 | Okuda |
| 6,127,254 A | 10/2000 | Diebold et al. |
| 6,137,063 A | 10/2000 | Jiang |

(Continued)

FOREIGN PATENT DOCUMENTS

| CN | 1343007 A | 4/2002 |
|---|---|---|
| CN | 1420557 A | 5/2003 |

(Continued)

OTHER PUBLICATIONS

Office Action for U.S. Appl. No. 11/351,418, mailed on Nov. 24, 2009.
Notice of Allowance for U.S. Appl. No. 11/351,418, mailed on Sep. 20, 2010.
Office Action for U.S. Appl. No. 11/593,788, mailed on Jun. 4, 2009.
Office Action for U.S. Appl. No. 11/593,788, mailed on Feb. 4, 2010.
Office Action for U.S. Appl. No. 11/593,788, mailed on Jun. 23, 2010.

(Continued)

*Primary Examiner* — Bilkis Jahan
(74) *Attorney, Agent, or Firm* — Kilpatrick Townsend and Stockton LLP

(57) ABSTRACT

The present invention relates generally to assembly techniques. According to the present invention, the alignment and probing techniques to improve the accuracy of component placement in assembly are described. More particularly, the invention includes methods and structures to detect and improve the component placement accuracy on a target platform by incorporating alignment marks on component and reference marks on target platform under various probing techniques. A set of sensors grouped in any array to form a multiple-sensor probe can detect the deviation of displaced components in assembly.

19 Claims, 11 Drawing Sheets

(56) References Cited

U.S. PATENT DOCUMENTS

| | | | |
|---|---|---|---|
| 6,181,567 | B1 | 1/2001 | Roemer et al. |
| 6,245,582 | B1 | 6/2001 | Yamaguchi et al. |
| 6,278,193 | B1 | 8/2001 | Coico et al. |
| 6,288,426 | B1 | 9/2001 | Gauthier et al. |
| 6,376,263 | B1 | 4/2002 | Franz |
| 6,385,223 | B1 | 5/2002 | Kurihara |
| 6,474,997 | B1 | 11/2002 | Ochiai |
| 6,503,089 | B2 | 1/2003 | Saijo et al. |
| 6,522,518 | B1 | 2/2003 | Barnett |
| 6,548,827 | B2 | 4/2003 | Irie |
| 6,579,430 | B2 | 6/2003 | Davis et al. |
| 6,628,136 | B2 | 9/2003 | Roberts et al. |
| 6,775,153 | B2 | 8/2004 | Hashimoto |
| 6,878,435 | B2 | 4/2005 | Paik et al. |
| 6,914,259 | B2 | 7/2005 | Sakiyama et al. |
| 7,001,792 | B2 | 2/2006 | Sauer et al. |
| 7,009,683 | B2 | 3/2006 | Sato |
| 7,077,659 | B2 | 7/2006 | Weiss et al. |
| 7,224,174 | B1 | 5/2007 | Malendevich et al. |
| 7,232,758 | B2 | 6/2007 | Chen |
| 7,253,443 | B2 | 8/2007 | Yoshida et al. |
| 7,358,604 | B2 | 4/2008 | Heyen et al. |
| 7,402,897 | B2 | 7/2008 | Leedy |
| 7,928,591 | B2 | 4/2011 | Chen |
| 8,350,393 | B2 * | 1/2013 | Chen ........................... 257/797 |
| 2002/0030501 | A1 | 3/2002 | Ohtaki |
| 2002/0043101 | A1 | 4/2002 | Naitou et al. |
| 2002/0095304 | A1 | 7/2002 | Khazei |
| 2002/0096746 | A1 | 7/2002 | Cokely et al. |
| 2002/0105078 | A1 | 8/2002 | Lee et al. |
| 2002/0140107 | A1 | 10/2002 | Kato et al. |
| 2002/0158323 | A1 | 10/2002 | Iwasaki |
| 2002/0191835 | A1 | 12/2002 | Lu et al. |
| 2003/0085461 | A1 | 5/2003 | Sakiyama et al. |
| 2003/0181071 | A1 | 9/2003 | Weiss et al. |
| 2004/0196682 | A1 | 10/2004 | Funaba et al. |
| 2004/0262036 | A1 | 12/2004 | Brist et al. |
| 2005/0040836 | A1 | 2/2005 | Altmann et al. |
| 2005/0059173 | A1 | 3/2005 | Chuan et al. |
| 2005/0070133 | A1 | 3/2005 | Canella |
| 2005/0128453 | A1 | 6/2005 | Miura |
| 2005/0167795 | A1 | 8/2005 | Higashi |
| 2005/0253993 | A1 | 11/2005 | Chen |
| 2006/0115927 | A1 | 6/2006 | Yeo et al. |
| 2007/0020812 | A1 | 1/2007 | Hsu et al. |
| 2007/0187844 | A1 | 8/2007 | Chen |
| 2007/0210438 | A1 | 9/2007 | Briere et al. |
| 2011/0119906 | A1 * | 5/2011 | Chen ........................... 29/759 |
| 2011/0164951 | A1 | 7/2011 | Chen |
| 2011/0210329 | A1 | 9/2011 | Chen |
| 2011/0212549 | A1 | 9/2011 | Chen |

FOREIGN PATENT DOCUMENTS

| | | |
|---|---|---|
| CN | 101118899 B | 4/2012 |
| GB | 2412790 A | 5/2005 |
| GB | 2448959 B | 10/2011 |
| JP | 11-054560 | 2/1999 |
| JP | 2000-100873 | 4/2000 |
| JP | 2000-258494 | 9/2000 |
| JP | 2005-072626 | 3/2005 |
| JP | 2005-217071 A | 8/2005 |
| WO | WO 2005/015632 | 2/2005 |
| WO | WO 2007/095100 A2 | 8/2007 |

OTHER PUBLICATIONS

Office Action for U.S. Appl. No. 11/593,788, mailed on Dec. 7, 2010.
Examination Report for DE Patent Application No. 112007000316. 2, mailed on Oct. 15, 2010, 6 pages.
Examination Report for GB Patent Application No. GB0803726.9, mailed on Sep. 28, 2010, 3 pages.
Examination Report for GB Patent Application No. GB0803726.9, mailed on Jul. 7, 2011, 2 pages total.
Substantive Examination Adverse Report for Malaysia Patent Application No. PI 20080463, mailed on Jun. 30, 2010, 3 pages.
Office Action of Japanese Application No. 2008-554381, dated Aug. 9, 2011, 8 pages total.
First Office Action of Chinese Application No. 200780001159.3, dated Sep. 11, 2009, 14 pages total.
Second Office Action of Chinese Application No. 200780001159.3, dated Mar. 24, 2010, 27 pages total.
PCT International Search Report and Written Opinion of PCT Application No. PCT/US 07/03519, dated Nov. 28, 2007, 12 pages.
Examination Report for Malaysia Patent Application No. PI 20063695, mailed on Mar. 31, 2011, 2 pages.
Examination Report for Malaysia Patent Application No. PI 20063695, mailed on Aug. 30, 2012, 3 pages.
Examination Report for Malaysia Patent Application No. PI 20080463, mailed on Mar. 30, 2012, 45 pages.
Third Office Action for Chinese Patent Application No. 200780001159.3, mailed Nov. 2, 2011, 8 pages.
Fourth Office Action for Chinese Patent Application No. 200780001159.3, mailed Jun. 1, 2012, 14 pages.
Office Action for U.S. Appl. No. 12/835,926, mailed on May 1, 2012, 15 pages.
Office Action for U.S. Appl. No. 12/835,914, mailed on Sep. 20, 2012, 25 pages.
Notice of Allowance for U.S. Appl. No. 12/779,046, mailed on Jul. 20, 2012, 31 pages.
Notice of Allowance for U.S. Appl. No. 12/779,047, mailed on Jul. 10, 2012, 34 pages.
First Office Action for Taiwan Patent Application No. 096141775, dated May 28, 2012, 8 pages.
Office Action for German Patent Application No. 112007000316.2, dated Aug. 23, 2012, 6 pages.
Office Action for U.S. Appl. No. 12/779,048, mailed on Sep. 27, 2012, 27 pages.
Office Action for U.S. Appl. No. 12/779,052, mailed on Oct. 4, 2012, 23 pages.
Office Action for U.S. Appl. No. 12/835,917, mailed on Oct. 5, 2012, 17 pages.
Office Action for U.S. Appl. No. 12/779,051, mailed on Oct. 5, 2012, 32 pages.
Notice of Allowance for U.S. Appl. No. 12/779,046, mailed on Oct. 30, 2012, 13 pages.
Notice of Allowance for U.S. Appl. No. 12/779,047, mailed on Nov. 26, 2012, 18 pages.
Office Action for U.S. Appl. No. 12/835,922, mailed on Dec. 28, 2012, 21 pages.
Certificate of Grant for Malaysia Patent Application No. PI 20063695, dated Oct. 15, 2012, 3 pages.
Office Action for Japanese Patent Application No. 2008-554381, mailed Oct. 16, 2012, 5 pages.
Notice of Issuance for Chinese Application No. 200780001159.3, mailed Dec. 19, 2012, 4 pages.
Office Action for U.S. Appl. No. 12/835,926, mailed on Nov. 17, 2011, 8 pages.
Office Action for U.S. Appl. No. 12/779,046, mailed on Jan. 5, 2012, 11 pages.
Final Office Action for U.S. Appl. No. 12/835,914 mailed Jan. 14, 2013.
Daisy Chain (electrical engineering) Wikipedia article available at http://en.wikipedia.org/wiki/Daisy_chain_(electrical_engineering) (Mar. 2008 last updated Jan. 2013).
German Patent Office (DPMA) Communication from Examiner for application DE112007000316.2 (Jan. 24, 2013).
German Patent Office (DPMA) Office Action for application DE112007000316.2 (Mar. 26, 2013).
Non-Final action for U.S. Appl. No. 12/779,048 mailed Apr. 16, 2013.
Final Office Action for U.S. Appl. No. 12/835,922 mailed Apr. 26, 2013.
Non-Final Office Action for U.S. Appl. No. 11/593,788 mailed Apr. 22, 2013.
Final Office Action for U.S. Appl. No. 12/835,917 mailed Apr. 24, 2013.

* cited by examiner

Interconnect interface
to be in contact
with alignment mark and reference
mark

METHOD FOR ASSEMBLING A MULTI-COMPONENT ELECTRONIC APPARATUS

CROSS-REFERENCES TO RELATED APPLICATION

This application is a continuation application of commonly assigned U.S. patent application Ser. No. 11/351,418 of the same title, now U.S. Pat. No. 7,928,591 B2 filed Feb. 10, 2006, which claims priority to U.S. Provisional Application No. 60/652,217 filed Feb. 11, 2005, both of which are incorporated herein by reference in their entirety.

BACKGROUND OF THE INVENTION

The present invention relates generally to assembly techniques. Alignment and probing techniques to improve the accuracy of component placement during assembly are described. More particularly, the invention includes methods and structures to detect and improve the component placement accuracy on a target platform by incorporating alignment marks on components and reference marks on target platforms. The proper alignment of the marks is assessed with various probing techniques. A set of sensors grouped in an array to form a multiple-sensor probe can detect the deviation of displaced components in assembly. Merely by way of example, the invention may be applied to place packaged devices onto electronic substrates for the manufacture of electronic systems. However, it should be recognized that the invention has a much broader range of applicability.

Electronic devices have proliferated over the years. As the complexity and the operation speed of integrated circuits (IC) increase, it is not unusual to see an increasing number of devices with pin-counts exceeding hundreds or even a thousand. For example, high-speed designs requires many power and ground pins. Differential pairs are replacing the single-end signals at the input and output pins (I/O) of a device to meet the signal integrity requirements. In addition, as system-on-a-chip becomes a reality, more and more pins are added to the device I/O to supports more functions. Many if not all of these tend to increase the number of pins in a packaged device or component.

As the device pin-count increases, the pin pitch of the device tends to decrease to limit the package size. The reduced pin-pitch poses a challenge for the placement equipment to place components accurately on a target platform, such as a printed circuit board (PCB), especially if the pin pitch is smaller than 0.5 mm.

Conventional surface-mount equipment use the Cartesian coordinates at the center of a target land pattern as a reference point to place a component on a PCB. There is no feedback to monitor the accuracy of the component placement. Without proper feedback, the accuracy of the component placement is uncertain. Actually, the accuracy of the component placement is influenced by the imperfectness in the package's outline, the deviation of the component's contact array from an ideal grid location, the imperfectness in PCB mounting references, the aging and the intrinsic tolerance of the placement equipment, and so on. As the accumulative error is getting closer to the pitch size of the contact array, placing a component accurately on a PCB is becoming a greater challenge.

It is not uncommon to encounter component placement problems in a surface mount assembly line, especially for the placement of fine-pitch components. For example, if a BGA component is inaccurately placed on a PCB, it could cause the BGA's contact array to deviate from the ideal land pattern location, resulting in either inadequate soldering or solder bridging to adjacent pads on the PCB. A rework to fix these problems is tedious and expensive. It is even worse for the rework of a pricey, high pin-count component on a high density PCB.

Furthermore, manufacturers frequently use sockets to house high-end, high pin-count chips on motherboards. This enables users to choose proper speed grade components or to perform speed upgrade at field. However, there is no handy method for users or manufacturers to monitor if a chip has been properly inserted in the socket or if the chip is in good contact with the receptacle inside the socket.

Thus, it is seen that techniques for detecting and improving component placement accuracy and for detecting the contact status are desirable.

BRIEF SUMMARY OF THE INVENTION

The present invention relates in general to assembly techniques. According to the present invention, the alignment and probing techniques to improve the accuracy of component placement in assembly are described. More particularly, the invention includes methods and structures to detect and improve the component placement accuracy on a target platform by incorporating alignment marks on components and reference marks on target platforms. Proper alignment is assessed with various probing techniques. A set of sensors grouped in an array to form a multiple-sensor probe is used to detect the deviation of displaced components on a target platform. Merely by way of example, the invention may be applied to place components onto electronic substrates for the manufacture of electronic systems. However, it should be recognized that the invention has a much broader range of applicability, such the precision alignment of a set of different objects.

In a specific embodiment, the present invention provides a solution for ICs or packaged devices which have a set of one or more alignment marks in predetermined spatial regions on the IC or packaged device. Depending on the embodiment, the packaged device, containing a plurality of I/O contacts, can be an integrated circuit device encapsulated in a suitable material, such as plastic (e.g., epoxy), ceramic (e.g., aluminum dioxide) or other material, and a plurality of bonding pads connected to its I/O contacts. The packaged device can be a multiple-IC stacked device, a multiple-package stacked device, or a multiple-chip carrier. The packaged device can also be an integrated circuit device laminated with an anisotropic conductive elastomer (ACE) membrane as an interconnect interface for external connections, and so on. One or more sensors monitor the placement of the set of alignment marks of such a packaged device on a target substrate or platform to determine if the external contacts on the device are accurately placed relative to a land pattern on the target substrate or platform, such as a printed circuit board, mother board, ceramic board, bare die IC, or other packaged device or component. If the packaged device is inaccurately placed, the alignment mark can also be used to obtain feedback to adjust the device position deviation. For simplicity, the ICs and packaged devices will be referred to as components.

In a specific embodiment, an alignment mark is a reference area on a component that an external probe can use to monitor the accuracy of a component placement on a target platform. The alignment mark incorporated on the component can be a conduction path connecting a top surface area to a bottom surface area of the component as a direct alignment mark, or it can be a different conduction path connecting two surface areas on the bottom of the component as an indirect alignment mark. Besides being a conduction path within the component, the alignment mark can also be a simple surface marking on the component, depending upon the probing method used. The structure of an alignment mark can be a simple geometric structure or a set of geometric structures.

For each alignment mark on a component, a reference mark can be added to a target platform for the component placement to refer to. In a specific embodiment, the present invention provides a solution for placing a component on a target substrate or platform, such as printed-circuit board, mother board, ceramic board, bare die IC, or other packaged device or component, by incorporating a set of one or more reference marks at pre-determined regions on or within the component. The reference marks can be connected to other reference marks on the same target platform to create a conduction path. A reference mark can be connected to a ground point in a target platform, or it can simply be a surface marking on the target platform, depending upon the probing method used.

In preferred embodiments, the present invention provides probe solutions for improving the accuracy in component placement. The probe can be a single-sensor probe or it can be an array of sensors. A single-sensor probe can detect the accuracy of a component placement and the status of a component's contact condition on a target platform. A probe composing of an array of sensors to become a multiple-sensor probe can adjust the deviation of a displaced component by aligning the one or more alignment marks on the component to the probe position that has been aligned to a reference mark. A multiple sensor probe can detect the deviation of a component and feed back the information to the placement equipment to fix the position deviation. While a single alignment mark can fix the component displacement error, two alignment marks can fix the placement orientation error. The probe can be a resistance probe, a capacitance probe, an optical probe, or any combination thereof. The resistance probe is for on/off measurements, the capacitance probe is for measuring the relative overlapping area between a sensor surface and a target reference, and the optical probe is for measuring the reflection from a target reference. The resistance probe is a contact probe. The capacitance probe and optical probe are non-contact probes. The range of active sensors on the multiple-sensor probe can be determined automatically by sensing the size of a target reference mark.

In a specific embodiment, the present invention provides a method for aligning a component on a target platform under various probing techniques.

The method includes placing a component containing one or more alignment marks to a region on a target platform. The region on the target platform contains a target structure and a set of reference marks to be monitored by a probe to determine whether or not the component has accurately been placed on the target structure. On a PCB, the target structure is a component land pattern. For each alignment mark on the component, a corresponding reference mark can be included on the target land pattern. The spatial relationship of the alignment marking on the top to the contact array on the bottom of the component should match the spatial relationship of the reference marking with respect to the contact array on the land pattern. The method also includes the way to align the multiple-sensor probe to the target land pattern, to determine the active range of the set of multiple sensors, and to adjust the component position with respect to an aligned probe.

Since the spatial relationship of alignment marks to the associated contact array can be accurately controlled in the device fabrication or component packaging process, a fixed spatial relationship between an alignment mark and a contact array on a device or package can be ensured. This allows a package with a minor obliquity in its physical outline (an oblique package) or a bare die not perfectly centered-cut along the scribing line between adjacent dies (off-center-cut die) to still be used for assembly. This is because in assembly the component placement can rely on the position of the alignment marks, rather than counting on the geometrical tolerance of the package outline. In a specific embodiment, the present invention provides a method for mounting a physically out-of-specification device or package on a prospective contact region on a PCB or target platform. Many physically out-of-specification devices which previously would have caused a misalignment problem in assembly no longer need to be rejected. A larger tolerance in the die cutting of device or in the molding of component package means a higher component yield.

Many benefits can be achieved by way of the present invention over conventional techniques. The present technique provides an easy to use process that relies upon conventional technology. In some embodiments, the method provides a mean to improve yields, reduce rework, and enhance placement accuracy. Additionally, the method provides a process that is compatible with conventional process technology without substantial modifications to the conventional equipment and processes. The present invention is especially useful for the devices with ultra-fine contact pitch and contact count exceeding hundreds or even a thousand.

Moreover, the invention provides a method for monitoring the placement of devices packaged with anisotropic conductive elastomer (ACE) as an interconnect interface. It enables the assembly of non-solder-ball based packaged devices onto a target platform or PCB effectively and precisely for a variety of applications. The anisotropic conductive elastomer contains a sea of tiny conducting metal tubes embedded in an elastic insulating silicone membrane that conducts current only in a certain direction. It has been used as an interconnect in high density and high pin count test sockets to offer excellent contact, repeatability, and high frequency characteristics in IC device tests. It is feasible to be used as the interface interconnect for devices and packages. A device or component laminated with ACE can be directly mounted onto a target substrate. A clamp shell can be used to hold the devices together without the need of soldering the devices onto a target substrate if an accurate placement can be achieved. The alignment technique can make the assembly of ACE laminated devices on electronics system feasible.

Depending upon the embodiment, one or more of these benefits can be achieved and will be described in more detail throughout the present specification. Various additional objects, features and advantages of the present invention can be more fully appreciated with reference to the detailed description and accompanying drawings that follow.

BRIEF DESCRIPTION OF THE DRAWINGS

FIG. 10 illustrates the use of three sets of latches to align a small alignment mark to the center of a large reference mark. The third digit in the tuple indicates the effective range of active test points for a smaller alignment mark to align to.

DETAILED DESCRIPTION OF THE INVENTION

Figure 1A:
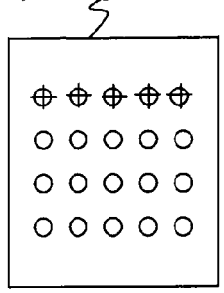
FIG. 1A is an example of an ideal package.

According to the present invention, alignment and probing techniques to improve the component placement accuracy during assembly are described. More particularly, the invention includes methods and structures to detect and improve the component placement accuracy on a target platform by incorporating alignment marks on a component and reference marks on a target platform with various probing techniques. A set of sensors grouped in an array to form a multiple-sensor probe can detect the deviation of displaced components in assembly. Merely by way of example, the invention can be applied to placing packaged semiconductor devices onto electronic substrates for the manufacture of electronic systems. But it would be recognized that the invention has a much broader range of applicability. Further details of the present invention can be found throughout the present specification and more particularly below.

Alignment Mark

According to preferred embodiments, an alignment mark is a reference region on a component that an external probe can use it to monitor the accuracy of component placement on a target platform. The alignment mark incorporated on the component can be a conduction path connecting a top surface area to a bottom surface area on the component as a direct alignment mark, or it can be a different conduction path connecting two surface areas on the bottom of the component as an indirect alignment mark. Although the top-down conduction path does not need to be a straight path, with a straight path from top to bottom or a matching top and bottom location on the component it is easier to visualize the position of the bottom contact point associated with the alignment mark. The surface area of the conduction path on the bottom can be either the contact point on the contact array or a different access point. Besides being a conduction path within the component, the alignment mark can also be a simple surface marking on a component, depending upon the probing method used. The structure of an alignment mark can be a simple geometric structure or a set of geometric structures.

An alignment mark on a component can be a single alignment mark or a set of alignment marks. Normally, one alignment mark is adequate. A second alignment mark is added to the component if the component size is large or may require an orientation adjustment to improve the placement accuracy. The tangential deviation from the ideal land pattern for far-end contacts in a large component could be significant if there is an orientation error. For a small component, the impact due to a minor orientation error is insignificant.

Depending upon the probing techniques, a probe can be either in direct contact or not in direct contact with the alignment mark when it is used to monitor the component placement accuracy. If a resistance probe is used to monitor the position of an alignment mark, it requires a direct contact. If a capacitance probe is used to monitor the position of alignment mark, it does not require a direct contact. In both cases, the alignment mark is an electrical alignment mark because there is a conduction current flowing through the alignment mark, except one is a DC current and the other is an AC current. If an optical probe is used to monitor the reflection from the surface of an alignment mark, then the alignment mark is an optical alignment mark. Thus, a reflective, conductive marking on the top surface of a component can be used as an electrical alignment mark or as an optical alignment mark depending upon how the alignment mark is constructed and which probing technique is used.

Reference Mark

For each alignment mark on a component, a corresponding reference mark can be added to a target platform for component placement to refer to. The spatial relationship of the alignment mark to the contact array on the component should match the spatial relationship of the reference mark to the associated land pattern on the target platform. The reference mark can be part of the component contact land pattern on the target platform. Depending upon the probing technique and the application requirements, the reference mark may or may not need to make a direct contact with the bottom of the alignment mark. In a special case, if the reference mark is simply a surface marking on a target platform and if the alignment marking is also a simple surface marking, then the top position of the alignment marking on the component can be chosen in such way that it matches the center point or one of the corner points of a contact array on the land pattern to eliminate the need for additional reference marks on the target platform.

Uncertainty in Component Placement

One useful aspect of the herein described alignment techniques is that the placement accuracy no longer relies on the component's physical outline, nor does it rely on the grid accuracy of a contact array relative to the edges of a component. For example, if the molding process causes a minor obliquity in the finished package such that the contact array on the package is not perfectly in parallel with the edge of the package (an oblique package), it is difficult to place the package correctly on a land pattern under conventional technology, especially when the package size is large and the array pitch size is small; nor for a package with its contact-array shifted from the ideal grid location (an off-grid package). Conventional placement equipment uses the Cartesian coordinates at the center of the land pattern as a reference point to place a component on it, based on the assumption that the component's physical outline is perfect and its contact array is precisely located relative to the edges of the component per package mechanical specifications.

Figure 1B:
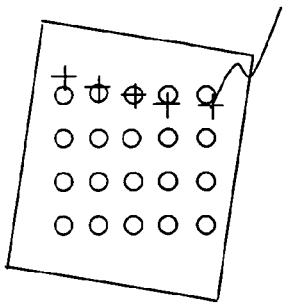
FIG. 1B is an example of an oblique package.
Figure 1C:
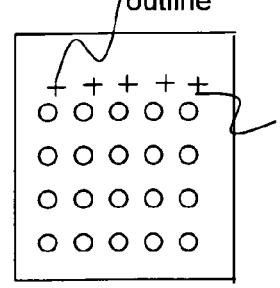
FIG. 1C is a different example of an out-of-specification package with a contact array off-grid.

FIG. 1A shows an example of an ideal package. It has a perfect physical outline and all package contacts are on prescribed grid locations. FIG. 1B shows an example of an oblique package, where the contact array is not in parallel with the package physical outline and is tilted from the ideal grid location as viewed from the package outline. FIG. 1C shows a different example of an out-of-specification package where the contact array is not properly center-molded and thus bears an offset from ideal grid location as viewed from the package outline. The packages in FIG. 1B and FIG. 1C are out of physical specification and are difficult to use in conventional surface mount assembly. The imperfections in the drawings are exaggerated to illustrate the concept.

Figure 2:
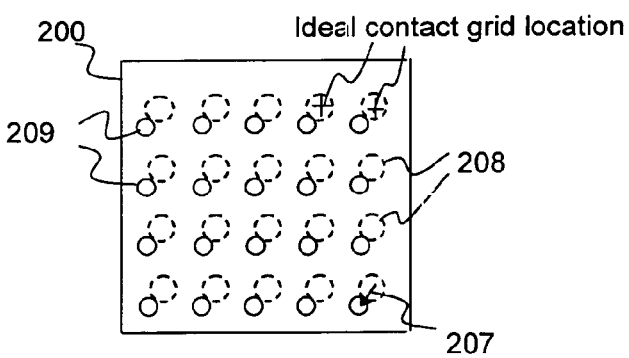
FIG. 2 shows the placement of an off-grid component on a land pattern. All contacts on the component are shifted by a same offset from the land pattern after placement.

FIG. 2 shows an example of placing an off-grid component 200 on a target land pattern 208. As shown, the contact array 209 on component 200 suffers an offset 207 in the lower-left direction. All contacts on component 200 will have the same offset 207 from the target land pattern 208 after placement. This is different from the placement of an oblique package where the skew or offset at the corner contacts is larger than that at center.

Adding alignment marks to a component could significantly reduce the adverse impact due to the imperfection in the package outline and eliminate the contact position uncertainty caused by the deviation of a contact array from its ideal grid location, even if the package outline is still in spec. The alignment mark can be placed within or beyond the component's contact array. It is fabricated at a predetermined spatial relationship with respect to the component's contact array, rather than at a location based on the component physical outline or the distance from the edge of package.

The alignment mark decouples the equipment's reliance on the ideal physical outline of components. Thus, some physically out-of-specification components that were scraped in production before, such as packages with a minor obliquity in physical outline, packages with a contact array deviated from an ideal grid location, or bare dies not perfectly centered cut along the scribing line between adjacent dies, could become useable for system assembly. Further detail of the structure and the operation of the alignment mark are described as follows. Certain methods and variations are also provided throughout the present specification.

Component Alignment Using a Resistance Probe

In this embodiment, an alignment mark is an electrical conduction path incorporated in a component or package at a pre-determined spatial location with respect to its contact array. The conduction path can be constructed from the top surface of a component, where a test signal can be applied, to the bottom surface of the component, where a matching contact or reference pad on a target platform can be connected underneath. The conduction path on the component and the matching reference pad on the target platform are paired to monitor the accuracy of the component placement. If a component were accurately placed on a target platform, the matching reference pad would appear underneath the bottom surface of the conduction path and a conduction current would be detected when a voltage were applied to the top surface of the component.

Figure 3:
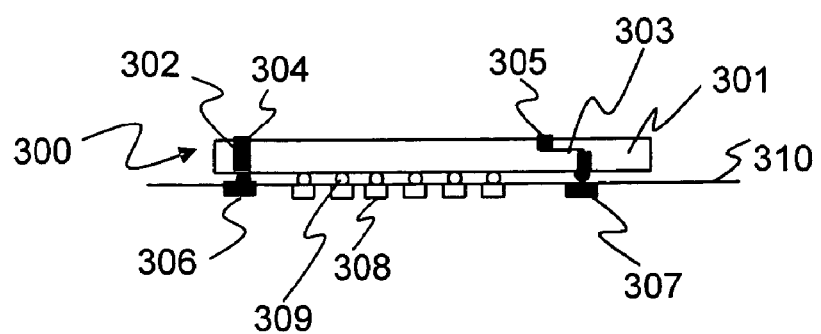
FIG. 3 illustrates the placement of a component with a set of conduction paths on a target platform with a matching land pattern and reference marks for checking the placement accuracy and contact condition.

FIG. 3 shows an example of placing a component 300 on a target platform 310. The component 300 is an encapsulated package 301 with a plurality of external connections at contact array 309 and one or more conduction paths 302, 303 as alignment marks. On the target platform, a land pattern 308 and a set of reference pads 306, 307 are pre-fabricated. The reference pads 306, 307 would be underneath the bottom surface of the conduction paths 302, 303 if the component 300 were aligned to a land pattern 308. This diagram is merely an example, which should not unduly limit the scope of the claims herein. One of ordinary skill in the art would recognize many variations, modifications, and alternatives, such as the component can be a bare die with an embedded conduction path from top to bottom as an alignment mark, an integrated circuit encapsulated in a plastic package or in a ceramic material package with solder bumps, or a device laminated with a layer of an ACE membrane for external interconnects but without solder bumps, or any combination of these, and the like.

The conduction path in component 300 can be a straight pipe or any irregular shape of conduction trace 303 running from top to bottom in the component. One or more conduction paths can be incorporated in the component. The external accessible points 304, 305 associated with the conduction paths 302, 303 can be a simple circular pad. Other pad shapes, such as square, rectangular, triangle, trapezoid, or a combination of these, may be used. A resistance probe is placed on the external access points 304, 305 to monitor the status of the placement accuracy. The conduction path can be a metal, a doped semiconductor path, or other detectable entity.

In FIG. 3, a set of reference pads 306, 307 is pre-fabricated on the target platform 310 as a target reference to guide the component placement. The reference pad can be a simple circular pad, although other shapes, such as a square, a rectangular, a triangle, a trapezoid, a set of ground dots, or a combination of these, may also be used. The reference pads 306, 307 on target platform 310 are named the "reference marks". For an alignment mark on a component, a correspondent reference mark can be added to the target platform. The location of the reference mark on the target platform 310 is pre-fabricated in such a way that the spatial relationship between the reference marks 306, 307 and the land pattern 308 on the target platform matches the spatial relationship between the bottom contact of alignment marks 302, 303 and the contact array 309 on component 300.

The size of a reference mark is determined by the variance of the placement system, which includes such factors as the imperfections in a component's outline or contact array, imperfections in a target platform, in the equipment's precision, effects of mechanical aging, database rounding errors, etc. A system with larger cumulative placement uncertainty requires a larger reference mark. The size of the reference mark should be large enough that at each initial component placement the alignment mark will be at least partially within the boundary of the target reference mark. The initial component placement is the placement based on the coordinates of the reference mark or target land pattern stored in the placement database. In addition, the size of the alignment mark is preferably the same as or smaller than the size of reference mark, since it can impact the accuracy of the component placement, as will be explained later.

Figure 4:
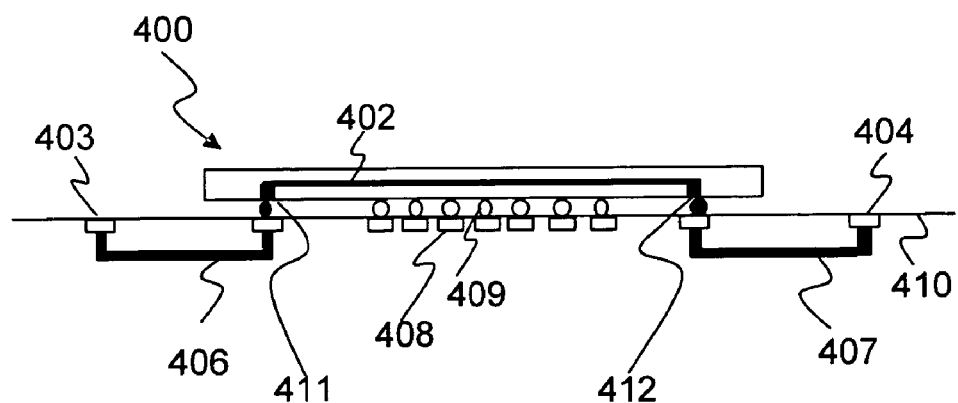
FIG. 4 shows a different configuration of an alignment mark, where all test-accessible points are on the same side as the contact array. It is a simplified diagram of an indirect alignment path and an indirect alignment mark.

Besides a top-down structure, where one test point associated with the conduction path is at the top surface of component, it is also possible to have both test points 411, 412 on the same side as the contact array 409, as shown in FIG. 4. Two additional traces 406, 407 are added to the target platform 410 in this case to connect the test points 411, 412 associated with the conduction path to the external accessible points 403, 404 on the target platform 410. The power and ground tips of a resistance probe can be applied to the two externally accessible points 403, 404 to detect if there is a conduction current to determine if the component has been correctly placed on the target land pattern 408. The conduction path with both test points located at the same side as the contact array is called an indirect alignment path. Its contact points are the indirect alignment marks.

If several indirect alignment paths on different components are connected into a serial daisy chain on a target platform, it can be used to monitor the contact condition of all of the components in the chain or to check if all of the components are still in place when the system is in use. This is useful for electronic systems assembled with solderless components, such as components using ACE as the interconnect interface, where the indirect alignment paths for all ACE based components can be connected in a single alignment chain or in several shorter chains. A supply voltage and detectors, such as LED diodes, can be connected to each chain to monitor the connection status of all solderless components in the chain.

Incorporating alignment marks on components not only can detect the accuracy of a component placement on a target platform, but also can fix the component position deviation after placement. However, it is the configuration of a test probe and the handling of signals detected by that test probe that determine the functions of the alignment mark. While a single-test-point probe, namely a single-sensor probe, can detect the placement status and the interface contact condition, a multiple-test-point probe, namely a multiple-sensor probe, can detect the direction and the magnitude of a deviation in the component placement, as is explained later herein.

Figure 5:
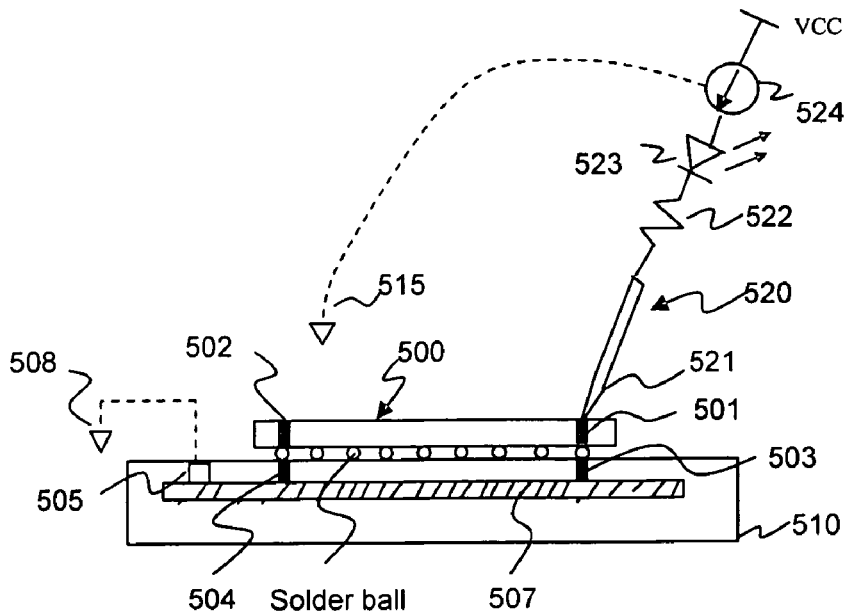
FIG. 5 shows an example of using a single-detection-point probe to check for the placement accuracy and the component contact condition.

FIG. 5 shows an example of using a single-test-point resistance probe 520, to monitor the alignment status of a component 500 on a target platform 510. Assume a component 500 containing two alignment marks 501 and 502 has aligned to a land pattern on target platform 510, where there is a set of corresponding reference marks 503 and 504. A conduction path is formed from the supply tip 521 of the probe 520, through the alignment mark 501, to the reference mark 503 on the target platform 510. A second conduction path is from the alignment mark 502 to the reference mark 504 on the target platform 510.

To avoid the two reference marks 503, 504 from floating at test, both should be connected to an internal plane 507 on the target platform 510, which is connected to a known reference voltage or ground 508 through a surface contact 505. A different approach is to connect the two reference marks together internally. A probe can be applied to test the connectivity after a component is placed. For example, if the supply tip 521 of probe 520 is applied to the top surface of the alignment mark 501 and its ground tip 515 is applied to the top surface of the alignment mark 502, then a closed current loop is formed to detect a conduction current from the probe's test tip 521, through the alignment mark 501, the reference mark 503, the internal trace or plane 507, back to the reference mark 504, the alignment mark 502, and finally to the probe ground tip 515, if the component 500 is well aligned on the target platform 510. Although two alignment marks are shown, one alignment mark is adequate if the orientation error is less likely in the component placement.

Alternatively, if the reference pads 503, 504 are connected to an internal plane 507 and a reference voltage or ground 508 is applied to the surface contact 505, then the reference pads 503, 504 will be at the reference voltage or ground. As the test tip 521 is applied to the top surface of any alignment mark on the component 500 in this case, a closed loop is formed from the probe, through the alignment mark, the corresponding reference mark, to the system ground and then to the probe ground, provided that the two grounds are connected together.

As shown in FIG. 5, a test probe 520 may contain a resistor 522, a light-emitting diode 523, a sound buzzer, or a current meter 524 to indicate the status of the placement. The resistor limits the maximum current to flow through the probe and the alignment mark. The light-emitting diode provides a visible signal to indicate if it is an accurate placement. The sound buzzer enables users to hear. The current meter shows the amount of current through the probe. The probe can be built into the placement equipment for monitoring the placement status. It can also be a probe for checking the component placement accuracy and contact condition by users manually.

Figure 6:
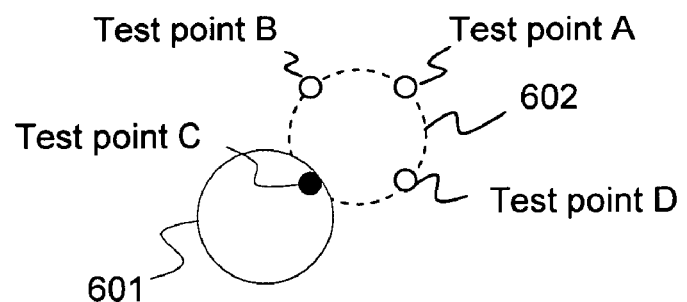
FIG. 6 shows an example of using a 4-point probe for detecting the position deviation in a component placement.

FIG. 6 illustrates the use of a 4-point probe to improve the accuracy of component placement. A multiple-detection point probe is essential to fix the component deviation in placement. A 4-point resistance-probe with test points A, B, C, and D is used in this example. A circular reference mark 602 is shown in a large dot circle. An alignment mark 601 also in a circular shape is shown in a large solid circle. To make the illustration simpler, assume that the size of the electrical alignment mark 601 is the same as the size of the reference mark 602, and also assume that the probe used in this placement has all four test points match the circumference of the reference mark 602. If a square reference mark is chosen as an example, then all four test points on the probe should match the four corners of the square reference mark after the probe position is aligned with the reference mark.

To fix the deviation in component placement, first the probe position needs to be aligned with respect to the reference mark by moving all four test-points A, B, C, and D on the probe onto or adjacent to the boundary of the target reference mark 602. Then, a component is moved in and placed at the coordinate of a target land pattern per the information stored in a placement database. If there were a deviation in component placement, the alignment mark 601 on the component would only partially overlap with the target reference mark 602 on the target platform. The 4-point resistance probe can detect this partial overlapping. For example, assume the deviation is toward the lower, left corner and only the test point C at the lower, left corner is in contact with the alignment mark 601. Then, only the test point C detects a current flow through the alignment mark 601 to the ground reference mark 602. There is no current being detected by the test points A, B, and D. This is because they are in a region outside the alignment mark 601, which is not electrically conductive. Using this test result as a feedback, the placement equipment can thus know the deviation of the component placement. In this example, shifting of the component position upward and right-ward can fix the placement deviation, i.e., from the direction where current is detected through the alignment mark 601 by test points to the direction where no current is detected. This process continues until the alignment mark 601 on the component is moved to a new position in contact with all of the test points. Then, the component is accurately positioned.

Consider the situation where, after the component placement, the alignment mark 601 is at a location such that two test points detect conduction current, say, for example, the two left test points. Then the alignment mark, and the component, should be shifted rightward until it reaches a position such that all four test-points can detect the current flow. In this case, the test probe, the reference mark and the alignment mark are all aligned and the component is accurately placed. The test probe and a component's pickup header in the placement equipment can both be adjusted independently.

Adjusting the test probe in line with the target reference mark at the beginning of each component placement is essential to ensure the placement accuracy. In this special case it can be done without a component between the probe and reference mark by making the probe contact the reference mark. The deviation from the center of the probe to the center of the target reference mark can be determined by monitoring which test points conduct current. By shifting the probe position toward the direction where no current is detected by the test points, the probe can be aligned with the target reference mark. This is a probe alignment step.

A multiple test point probe has more capability than a single test point probe in monitoring the component placement. While a single-test-point resistance probe can be used to detect the placement accuracy and the contact condition, a multiple-test-point probe can be used to detect and provide feedback on the deviation of a displaced component.

Figure 7:
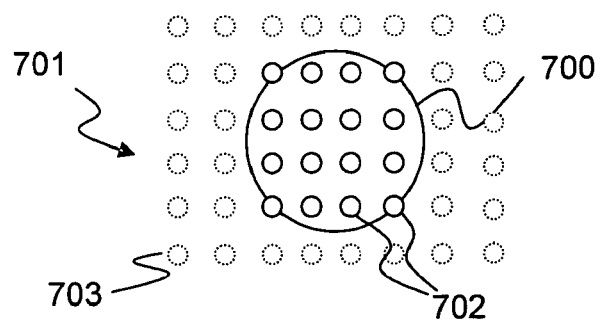
FIG. 7 shows a generalized test probe consisting of an array of test points for detecting the deviation in a component placement. The active test points on the probe can be determined on-the-fly.

FIG. 7 shows a generalized test probe consisting of an array of test-points 701. If the area detectable by the array of test points 701 is larger than the size of a reference mark 700, then only a subset of test points in the array will be activated to detect the position deviation. The subset of test points to be activated in each component placement can be determined automatically on-the-fly in a similar manner. This can be done by lowering the test probe—assume it is a resistance probe—so that it is in contact with the reference mark 700 and applying a voltage to all test points in the array 701 to see which test points conduct current.

If all test points conducting current were the inner test points in the array, then the inner test points detecting current 702 could be chosen to facilitate the component position adjustment. Those test points in the array not conducting current flow 703 could be ignored in the current component placement. The subset of inner test points in the array being activated to facilitate the component position adjustment is the active test points 702. Those test points being ignored in the position adjustment are the inactive test points 703.

Since the center of a multiple-test-point probe is known from the probe structure, the probe design can be simpler if the set of active test points can be repositioned to center around the center of the multiple-test-point probe. This can be done by moving the probe to a new position until all inner active test points are in the central region of a multiple-test-point probe. In this new position the center of the test probe is aligned with the center of the target reference mark and with the outer range of the active test points matching the boundary of the reference mark.

If part of the test points conducting current were at the edge of the multiple-test-point array, then either the size of the probe is too small or the probe position is not lined up with the reference mark. Assume the size of probe is too small, i.e., smaller than the size of the target reference mark. In this case there could be an uncertainty in the component position adjustment due to being unable to align the small probe to the center of the reference mark. Preferably, the range of test probe is compatible with or is larger than the size of reference mark. And if the probe position is not lined up with the reference mark, then it should be adjusted until the center of the active test points in the array are lined up with the center of the reference mark.

A set of asynchronous set-reset (SR) latches can be implemented in the electronics of a test probe, one SR latch for each test point on the probe. Corresponding to the subset of test points on the probe which are activated to monitor the component placement, a subset of SR latches is set to indicate the positions of the active test points for each component placement. The entire set of SR latches is cleared at the start of each component placement. A latch with write-enable can also be used to implement the function of a SR latch.

Figure 8:
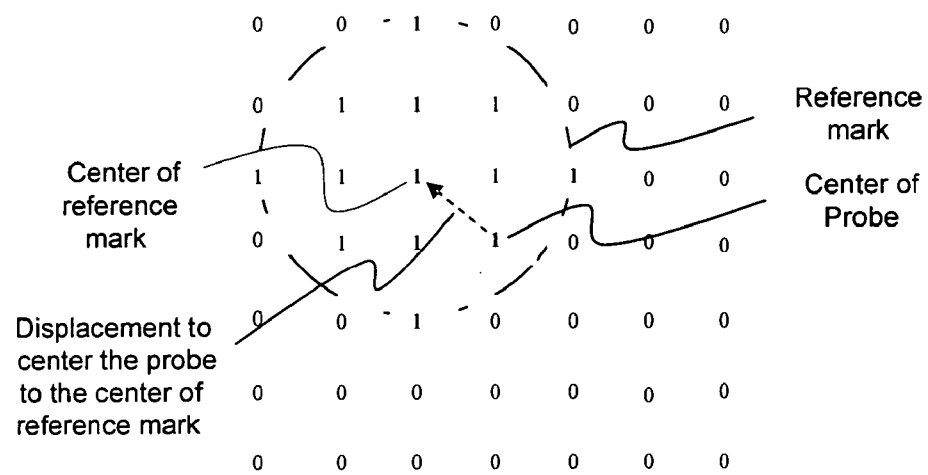
FIG. 8 shows an example on the use of a set of SR latches to track the positions of active test points and to align the center of a test probe to the center of a target reference mark. The set of SR latches and can be replaced by a set of latches with write enable.

FIG. 8 illustrates a method of using the set of SR latches for aligning a test probe to the center of a target reference mark. To align a multiple-test-point resistance probe to a reference mark, after making a contact with the reference mark, the SR latch is set if the corresponding test-point conducts current and the SR latch remains reset if the corresponding test-point detects no current. Counters can be used to scan all rows and columns on the set of SR latches to find out which row and which column detect the highest number of ones. The interception of the highest row and column is the center of reference mark. A row counter, a column counter, a comparator, registers for tracking the row number and the column number that have the highest number of ones, and a set of multiplexers to select proper inputs to these logic, etc., can be used to achieve such a function. This is merely an example, which should not unduly limit the scope of the invention. By comparing the row number and the column number that have the highest number of ones with the row number and the column number at the center of probe, the displacement to align the probe to the center of reference mark can be determined. The probe can thus be shifted accordingly to align with the center of the reference mark. After the re-positioning of the probe, the SR latches are cleared to record the new conduction status for all test points on the probe. The SR latches being set at this stage contain the information of the set of active test points aligned with the center of the reference mark.

For aligning a component, another set of transparent latches can be added to the probe electronics to track the instantaneous conduction status of all test points each time the component changes to a new position. The contents of transparent latches record the overlap status between the alignment mark and the reference mark. Their contents will be compared with the contents of the SR latches. If the contents of both sets match, then the component is accurately aligned on the target land pattern.

Figure 9:
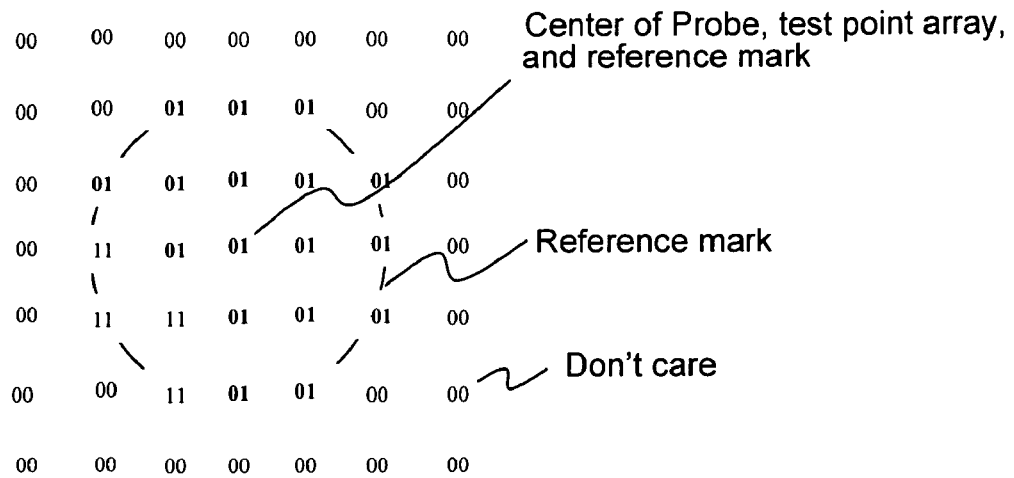
FIG. 9 illustrates the use of two sets of latches to determine the direction and displacement of a deviated component. One set of latches with status being shown in the first digit of a binary pair indicates the overlap status between an alignment mark and a reference mark. The other set of latches with status being shown in the second digit of a binary pair indicates the position of active test points.

FIG. 9 shows an example of using two sets of latches to derive the direction and displacement of a deviated component. The first digit in the binary pair is the status of the set of transparent latches, which indicates the overlap status between the alignment mark and the reference mark. The second digit in the binary pair is the status of the set of SR latches, which indicates the position of the active test points.

By comparing the contents of these two latches, or the value of the binary pair, the direction and the adjustment displacement for a misplaced component can be derived. To make the explanation simpler, by way of example, assume the size of the alignment mark is the same as the size of the reference mark. A "1" in the first digit indicates the area where the alignment mark overlaps with the reference mark. A "1" in the second digit indicates the location of active test points. By referring to the "11" region in FIG. 9, which is known by a simple AND logic, there are three columns to the right side containing all "01"s and only two rows to the up side containing all "01"s inside the reference mark range. The placement equipment thus knows that a shifting of three positions to the right side and two positions to the up side can reposition the component correctly. The position of test points containing "01" can be known by a simple exclusive OR gate. This illustration is merely an example, which should not unduly limit the scope of the invention.

While a larger reference mark can extend the range of adjustment for a deviated component, a smaller alignment mark can still work properly if the test probe is large enough, i.e., if the range of all test points on the probe is larger than the size of the reference mark. To support a smaller alignment mark, a third set of latches can be incorporated in the probe electronics to indicate the effective sub-range of active test points where the small alignment mark will be referred to as being in alignment. The third set of latches servers as an enable mask in determining the effective range of "01"s in the derivation of the component shift displacement.

Figure 10:
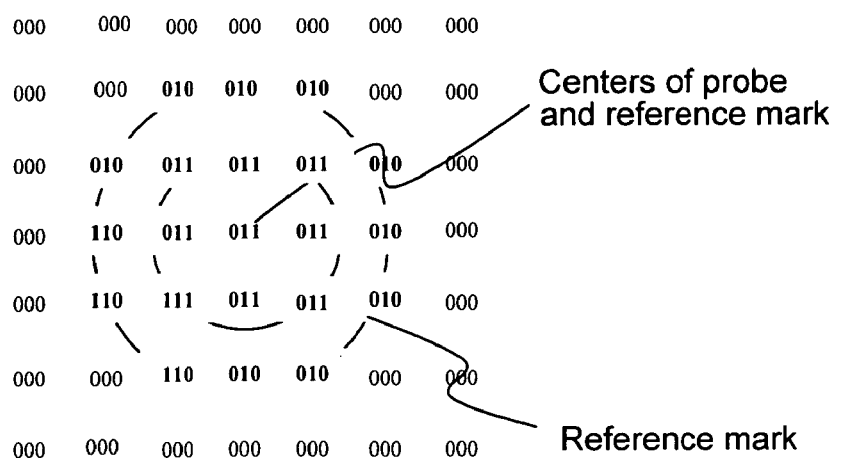

In FIG. 10, the third digit in a binary tuple indicates the sub-range inside a reference mark that matches the size of an alignment mark. A "1" in the third digit, such as the binary tuples "111" and "011", indicates the location of the sub-set of active test points for use as the target for a smaller alignment mark to align to. While the entire range of active test points, determined by the size of the reference mark, is used to detect the presence of the alignment mark, it is the sub-range of active test points being used as the target for the small alignment mark to align to. A "11" in the first two digits of the tuple, i.e., "11.times.", as shown in the example of FIG. 10, represents the overlapping area between the alignment mark and the reference mark. The tuple "011" indicates the area where the alignment mark is still not in line with the reference mark. There are two columns to the right side of "111" containing "011"s and two rows to the top side of "111" containing "011"s in the target sub-range in FIG. 10. Thus, a shifting of the component two positions upward and two positions rightward can still fully align the alignment mark to the reference mark, even if the alignment mark is smaller than the reference mark.

The actual sub-range of active test points associated with a smaller alignment mark can be derived by referring to the diameter information of the alignment mark stored in the placement database or by using an image sensor associated with the placement equipment to measure the diameter of the alignment mark on-the-fly.

Figure 11:
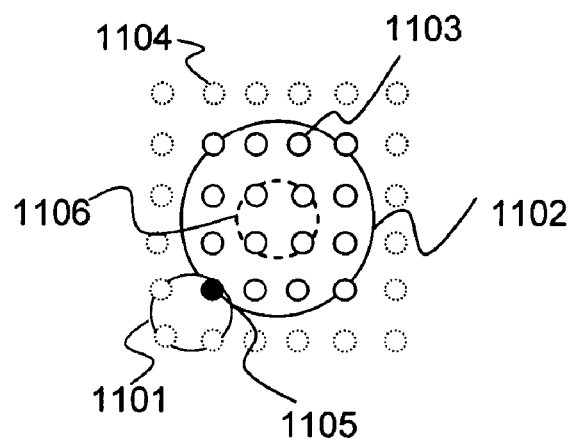
FIG. 11 shows a graphical interpretation on the use of a generalized probe to fix a deviated component, where the size of an alignment mark on a component is smaller than that of a reference mark.

FIG. 11 shows a graphical interpretation on the use of a generalized test probe to fix the position of a deviated component. An alignment mark 1101, which reflects the position of a component, is smaller than a reference mark 1102 in this example. Before each component placement starts, the range of active test points on the probe should be determined in advance, i.e., by moving the probe on top of the reference mark 1102, without a component between the probe and the reference mark, and applying a voltage to all test points to see which test points conducts current. Since the center of the test probe is known, the set of active test points can be chosen to have the probe in line with the center of the reference mark 1102 and to have the outmost active test points adjacent to the boundary of reference mark 1102. In FIG. 11, the inactive test points on the probe are shown as dot circles and the active test points are shown as solid circles and as a solid black dot. The sub-range of active test points to be used for aligning a smaller alignment mark to the reference mark can also be derived on-the-fly by using an image sensor inside the placement equipment to measure the diameter of the alignment mark or by referring to the diameter information of the alignment mark stored in a placement database.

After initial component placement, the alignment mark 1101 on the component is either entirely or partially within the range of the active test points being defined by the reference mark 1102. Assume there is a deviation in the initial component placement and assume only one corner active test point 1105, shown in the solid black dot in FIG. 11, detects current flow. The placement equipment could then use the subset of the active test points as a target to shift the alignment mark rightward and upward until the alignment mark matches the entire subset of active test points 1106, shown as the big, central dot circle in FIG. 11. Thus, the component can still be accurately aligned to a target land pattern even if the alignment mark is smaller than the reference mark.

On the contrary, if the area of the alignment mark were much larger than the area of the reference mark, the placement accuracy would be degraded. This is because the range of active test points defined by a small reference mark is rather limited. It would be unable to proceed with the component adjustment process because no adequate feedback would be available to instruct the large alignment mark on the component to move its center to line up with a limited set of active test points. For resistance probing, the effect of using a larger alignment mark is similar to the effect of using a single-test-point probe, where the area covered by a single test point probe is very narrow, similar to the effect of a smaller test probe or a smaller reference mark. Nevertheless, a smaller reference mark can detect much higher placement accuracy under a single-test-point probe, unless the size of the reference mark is too small to be detectable.

If, after an initial placement, the component were placed beyond the reference mark, then no o conduction current would be detected by any of the active test points. This would indicate that either the placement equipment was improperly set up, or that the worst-case deviation in the component placement was under-estimated, causing the alignment mark to fall beyond the under-sized reference mark. An improper system setup or operational error can thus be detected easily.

Figure 12:
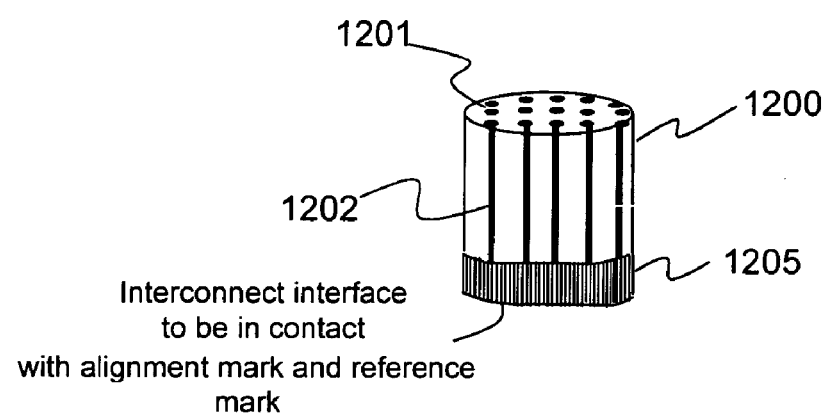
FIG. 12 is a simplified diagram showing a test probe laminated with ACE material at an interconnect interface to improve the contact condition between the test points and the alignment mark or between the test points and the reference mark.

To improve the durability of a test probe and to ensure good contact to an alignment mark and a reference mark, an anisotropic conductive elastomer (ACE) 1205 can be laminated on the surface of a generalized resistance probe 1200 as the interconnect interface, shown in FIG. 12. In this figure, each test point consists of a conduction pipe 1202 inside the probe 1200. This figure is merely an example, which should not unduly limit the scope of the invention. For example, the probe is shown in a circular shape, but other probe shapes, such as a square, a rectangular, a triangle, a trapezoid, other irregular shapes, or even a flexible cable, is likely. Also, although the test points are shown in a regular array in the figure, the test points in array can be arranged in any configuration based on the requirements of an application.

To resolve the orientation error in a component placement, two alignment marks can be incorporated on the opposite sides of the component. It is more likely to encounter an orientation error for components with a large contact array or an ultra-fine contact pitch.

Figure 13:
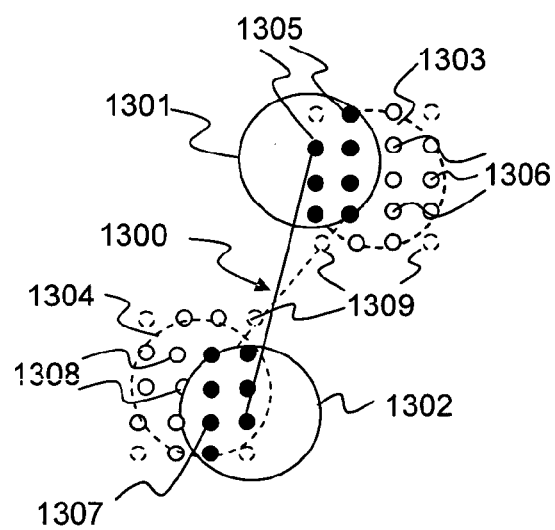
FIG. 13 shows that incorporating two alignment marks on a component can fix the orientation error in a component placement.

FIG. 13 shows an example of incorporating two alignment marks on a component to fix the orientation error in component placement. Assume that the component is tilted counter-clockwise after initial placement and assume that the size of an alignment mark is the same as the size of a reference mark. Two large solid circles in the diagram represent two alignment marks 1301, 1302 on a component. An artificial solid line linking these two-alignment marks 1301, 1302 is drawn to show an imaginary orientation of the component after initial placement. Two corresponding reference marks 1303, 1304 on a target platform are shown in large dot circles, connected by an artificial dotted line to indicate the ideal target orientation. The acute angle intercepted by the solid line and the dot line is the orientation error after the initial placement. Assuming that there is no displacement error, the interception point is the center of the component 1300. Two test probes may be used to monitor the placement of a component containing two alignment marks, although one is adequate if the active test points and the center of the test probe can be recorded by the placement equipment for each probing event.

Before placing a component, the probes must be aligned with the target reference marks. For a resistance probe, this is done by placing the probe in contact the reference mark to determine the range and the coordinates of the active test points with respect to the center of the reference mark. Then, a component is picked and placed at the target land pattern with the probe moved out of the way. If there is no orientation error in the component placement, both alignment marks 1301, 1302 will stay exactly on top of the reference marks 1303, 1304 and match the range of the active test points. If there is an orientation error, then some of the active test points on the probe will be outside the range of the alignment mark and conduct no current. By monitoring the conduction status of the active test points, the direction of the required adjustment can be determined, i.e., by rotating the component or alignment mark toward the side where the active test points detect no current, provided that the component movement assembly is capable of performing angular position adjustment.

In FIG. 13, the two alignment marks 1301, 1302 on the component are in the upper right and lower left locations. If a counter-clockwise orientation error occurs after component placement, then the active test points 1305 detecting conduction current will lean to the left-hand side for the upper probing and the active test points 1307 detecting conduction for the lower probing will lean to the right-hand side. By rotating the component from the side that active test points detect current to the side detecting no current, i.e., in the direction of clockwise rotation, the component orientation error can be fixed. If all current sensing tests points were to appear at the same side under both probing, say all on the left-hand side, then a displacement error had taken place and the component should be shifted right-toward to fix its displacement error.

The alignment technique can be adaptive to application needs. For example, if the placement system has intrinsic skew such that the placement error is larger in one direction than the other, then a rectangular reference mark can be chosen with its long side corresponding to the direction of the larger deviation. Preferably, the size of the probe is larger than the size of the reference mark in order to align the probe and to determine the range of the active test points on the probe automatically. Also preferably, the size of the reference mark is larger than or is about the same size as the alignment mark.

Resistance probing that requires direct contact measurements may cause contamination of solder paste around a target land pattern in situations when the displaced component needs to be moved around on the target platform. There is no such problem for the components laminated with ACE for use as an interconnect interface. The components laminated with an ACE interconnect interface also make good contact with the land pattern on the target platform.

To avoid the adverse effect of potential solder paste contaminations, it is also possible to laminate a thin layer of solder material on the surface of land patterns on PCB, similar to the solder ball material on a package, during PCB fabrication. Then, the solder paste-printing step can be eliminated in the surface-mount assembly, thus preventing solder paste contaminations.

Figure 14:
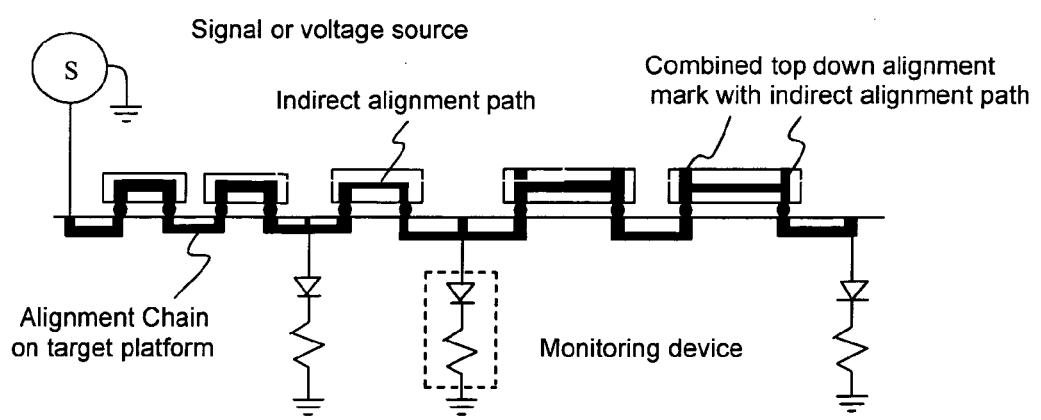
FIG. 14 shows a simplified diagram of a serial alignment chain on a target platform.

A top-down alignment mark and indirect electrical alignment paths can be combined and incorporated within a same component. The top-down alignment mark can improve the placement accuracy and the indirect alignment paths can be linked in a serial alignment chain to monitor the contact status of all components in the chain, as shown in FIG. 14. This is particularly useful for the electronic systems assembled with components laminated with ACE interconnect.

Alignment Using Capacitance Probe

The electrical alignment can also be achieved by using a non-contact method. Rather than using a resistance probe to measure the on/off resistance at the direct contact point, a capacitor probe can be used to align a component without touching or contacting it.

Figure 15:
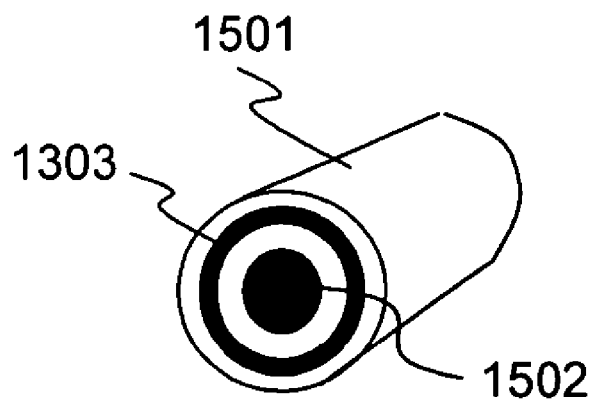
FIG. 15 is a simplified diagram of a capacitance sensor, which uses a guard to focus the sensor's electrical field.

FIG. 15 shows an example of a capacitance sensor manufactured by Lion Precision of St. Paul, Minn. To improve measurement accuracy, the electrical field from the sensor needs to be confined within the space between the sensor's surface and the reference target. A separate conductor kept at the same voltage as the sensor itself is used as a guard to surround the sides and the back of the sensor. When an AC signal is applied to the sensor, a separate circuit applies the exact same excitation voltage to the guard. Because there is no voltage difference between the sensor and the guard, there is no electrical field between them. Any other conductors beside or behind the capacitance probe form an electrical field with the guard, instead of the sensor. Only the unguarded front end of the sensor forms an electrical field with a reference target. The sensor creates an electrical field that is approximately a projection of its size and shape. For instance, a round sensor could project a cylindrical electrical field to a reference target. In Lion Precision's capacitor sensor, the cylindrical electrical field could spread up to 30% at an effective range of 40% of the sensor diameter.

As an AC signal is applied to the sensor surface, AC current will flow through the capacitance formed in the gap between the sensor and the target reference. The amount of current that flows is dependent on the amount of capacitance between the sensor and the target reference, i.e., the current is determined by the size of separation and the extent of the overlap between the surfaces. If the sensor is fully aligned with the reference target, the capacitance formed in the gap is the largest and the AC current will be the highest. If the sensor is entirely beyond the reference target, there is no surface area overlap and the capacitance is irrelevant, provided that no foreign conductor besides the reference target is within the sensor range.

Figure 16:
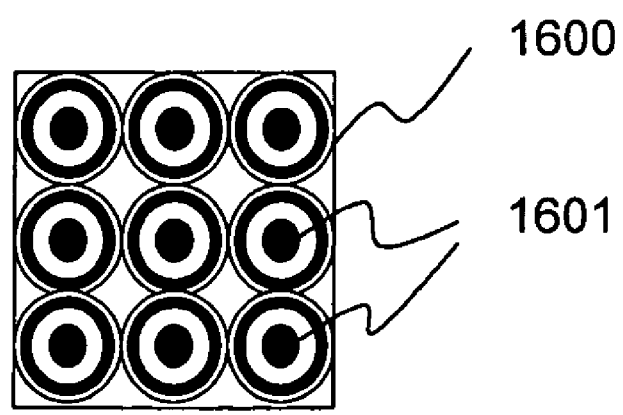
FIG. 16 is a simplified diagram showing a set of capacitance sensors grouped in an array to form a multiple-sensor capacitance probe for use in non-contact electrical aligning.

A set of guarded capacitance sensors can be grouped in an array to form a multiple-sensor capacitance probe, as shown in FIG. 16, for non-contact electrical probing. The sensors in the array can also be selectively activated as required. For example, FIG. 16 shows a nine-sensor probe, but if only the sensors at the four corners of the probe are activated for placement detection, then it becomes a four-sensor capacitance probe.

For probing alignment, the exact capacitance detected by each sensor on a probe is not a major concern. This is because in alignment applications the purpose of the capacitance sensor is not to measure the exact separation between two parallel objects, where a precise capacitance reading is essential. Rather, it is the relative capacitances, determined by the extent of the overlapping between the probe surface and the target reference area, which plays a key role. The effective range of a multiple-sensor capacitance probe for measuring the placement accuracy is greater than that of a single sensor, provided that no foreign conductor is within the range of the sensors' electrical field to disturb the relative capacitance measurement.

As an AC excitation is applied to all active sensors on a probe, all sensors will detect a same capacitance between the sensor and the target reference and thus will measure the same amount of AC current, provided the probe is fully aligned with the reference target. If misalignment exists, the portion of the active sensors on the probe detecting area overlap with the reference target will conduct the highest current while the portion of the active sensors beyond the reference target will conduct a minimal current. By comparing the relative magnitude of the AC currents among the array of active sensors, the direction of the deviation can be known. The deviation can be fixed by aligning the component alignment mark under the capacitance probe or by moving the displaced component toward the direction where the active sensors detect lower levels of AC current. The probe does not need to be in contact with the target platform or the component in this process.

A capacitance sensor is normally calibrated to a grounded target. The body or outer jacket of the capacitance probe should be electrically wired to ground to improve the probe accuracy. The reference target also requires proper grounding. A reference target which is not properly grounded could degrade the probe's sensitivity and accuracy. Fortunately, many targets, while not directly grounded, have a significant capacitance to ground though their environment, such as the component pickup header. The large capacitance eventually shorts the target reference to ground under AC excitation. Thus, connecting the reference mark on a target platform to a ground plane or connecting the alignment mark on a component's surface to its local ground is helpful but not essential as long as the ratio between the target's capacitance to ground and the target's capacitance to sensor is reasonably large. A ratio over 10 will result in an error in capacitance measurement of less than 10%, as seen in the case of two capacitances in series.

When using a capacitance probe to align a component, only the surface marking on the top of the component is relevant. The surface area of the alignment mark on top of the component determines the capacitance value detected by a capacitance sensor. An electrical conduction path from the top to the bottom of the component as an electrical alignment mark, as is used in the case of resistance probing, is no longer required. However, the Cartesian coordinate relationship between the alignment marking on the top and the contact array on the bottom of the component should match the coordinate relationship between the reference mark and the target land pattern on the target platform. Alignment of an alignment marking using a capacitance probe can be done by moving the alignment marking around under the capacitance probe, assuming the probe has already been aligned relative to a reference mark, and monitoring where all active sensors over the alignment marking detect a same amount of current which exceeds a certain minimum threshold. After the alignment marking is in line with the probe, the aligned component can be lowered down to be placed on a target land pattern accurately.

Using a non-contact probing, such as capacitance probing, aligning a probe to a target reference and aligning a alignment marking to the probe can be done independently. Thus, the size relationship between the alignment marking on the component and the reference mark on the target platform is no longer as critical as in the case of contact probing, provided that the probe detection range is large enough to cover both of them. Thus, a component with a large alignment mark can still be aligned accurately on a smaller reference mark by using a non-contact probing.

The electrical aligning technique can also be used to monitor the accuracy in the stacking of packaged chips, where a conduction path can be inserted from the top to the bottom of the packaged chip as an electrical alignment mark. The electrical alignment technique can also be used to monitor the accuracy in bare-die stacking, where a conduction path from the top to the bottom of a bare-die can be created using ion implantation, diffusion, or other methods.

Figure 17:
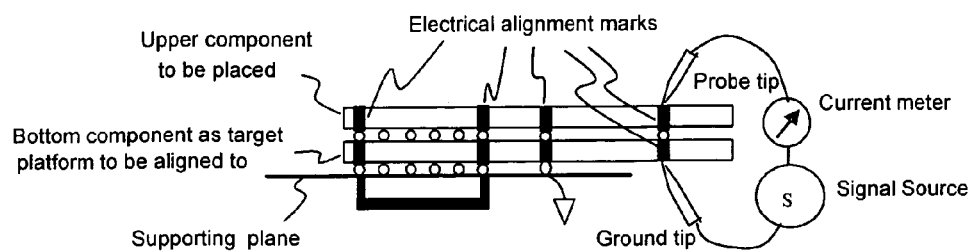
FIG. 17 in an example of the use of an electrical alignment technique to monitor component stacking.

FIG. 17 shows an example of using an electrical alignment technique to monitor the stacking of components. Several variations are shown in the example to illustrate the applications under different situations. The accuracy of component stacking can be known by directly placing a probe at the top of the top component alignment mark and at the bottom of the bottom component alignment mark. If the stacked components are to be placed on a supporting plane, the alignment mark at the bottom of the bottom component can be connected to a ground reference point on the supporting plane to create a monitoring path from probe to ground. As another option, a pair of electrical alignment marks can be incorporated on the components to be stacked, which can be connected to a conduction path in the supporting plane for the probe to monitor the stacking accuracy from the top of both alignment marks on the stacked components. The little circle in the figure indicates contact points to other stacked components or to the supporting plane.

Figure 18:
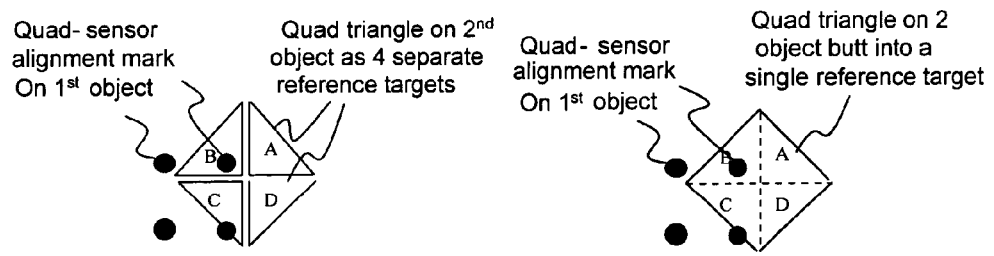
FIG. 18 shows a different application of an electrical alignment technique for aligning an object with a quad-sensor alignment mark onto a second object with a quad-triangle reference mark.

FIG. 18 shows a different way of using an electrical alignment method to align two objects together. In this example, an array of four sensors is incorporated in the first object and an array of four triangles as a reference target is incorporated in the second object for monitoring the alignment accuracy. The four reference triangles can be separated as four reference marks or can be abutted together to form a single reference mark as shown. The four sensors can be a set of resistance probes for use in a contact measurement or can be a set of capacitance probes for use in a non-contact approach.

The setup works in a similar manner. Assume the first object is deviated from the second object in the lower-left direction to cause the two left alignment sensors on the first object to lie outside the quad-triangle reference mark associated with the second object. Assuming the range of the sensor array and the range of the reference array are matched, an instruction to shift the first object to the right could be generated by the sensing electronics. After the first object is shifted to the right, the two lower sensors would then step beyond the reference mark region (triangles C, D) on the second object, but the two upper sensors would still be within the range of reference triangles at this moment. By moving the first object upward, i.e., toward the direction that the sensors have detected currents, the four alignment sensors can then be moved into the range of the reference mark and the two objects are finally aligned.

Alignment Using Optical Probe

Figure 19:
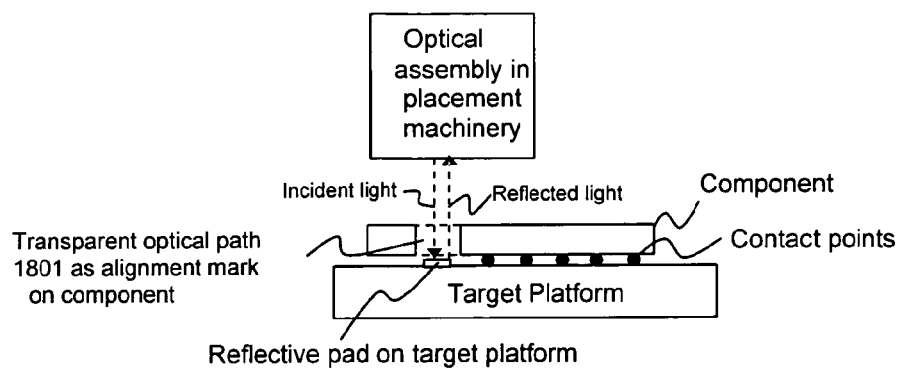
FIG. 19 shows how a transparent optical path on a component can be used as an optical alignment mark. If coupled with a matching a reflective pad on a target platform, it can be used to improve the component placement accuracy.

If the alignment marking on the top of a component and the reference marking on a target platform are highly reflective, an optical probe can be used for the component alignment. The alignment mark can also be a transparent optical path 1901 through a component that enables a laser beam to pass through and reflect back from a reference mark underneath, as shown in FIG. 19. Either a reflective surface marking on top of a component or an optical path through a component can be used as an optical alignment mark.

In optical probing, there is no need to ground the alignment mark or the optical path on a component, nor is there a need to ground the reference mark on a target platform. However, the spatial relationship between the alignment mark on the top and the contact array on the bottom of a component should match the spatial relationship between the reference mark and the associated land pattern on a target platform, as in other probing techniques.

Figure 20:
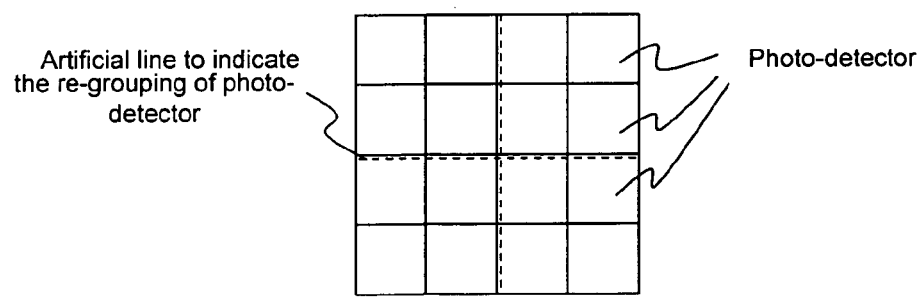
FIG. 20 is a simplified diagram showing an array of photo-detectors grouped in an array to form a multiple-detector optical probe for use in component alignment.

FIG. 20 shows a set of photo-detectors or photo-diodes grouped in an array to form a multiple-sensor optical probe for non-contact probing. The sensors in the array can be selectively grouped per the resolution requirements. For example, FIG. 20 shows a sixteen-sensor probe. But if the boundary of the reflection beam is out of focus and is slightly blurred or if the size of the reflection beam is rather large, then the sixteen photo-detectors on the optical probe could be rearranged into four groups to form a four-sensor optical probe. The re-arrangement of sensors can be done by re-arranging the input signals to the probe electronics. In a different example, if the incident beam can be adjusted and focused, only the four sensors at the center of the probe could be chosen as the target sensors of alignment to increase the alignment accuracy, although the entire range of all 16 sensors are used as active sensors to increase the incident beam search range.

If a generalized test probe, consisting of an array of test sensors, is a resistance probe, it measures the connection resistance or DC current at each contact point. If it is a capacitance probe, it measures the AC current at each test sensor, which reflects the area overlapping between the surface of each sensor and the target reference. If it is an optical probe, it detects the photocurrent at each photo-detector, which indicates the position of the reflection beam.

Using optical alignment, the probe position must be aligned with the center of a reference mark on a target platform at the beginning of component placement. The reference mark can be a simple reflective pad in optical alignment. Ideally, the diameter of an incident light beam shall be compatible with the size of the reference mark. Otherwise, an uncertainty takes place, regardless of whether the size of the incident laser beam is too large or the size of the reference mark is too large. On the detector side, the incident beam shall be properly focused to ensure it is within the range of the optical detectors. After aligning the probe to the center of the reference mark, a component is moved in and placed at the land pattern. Next, the alignment mark is aligned with respect to the position of the probe. For non-contact probing, this two-step indirect alignment method determines the ultimate accuracy in component placement. Depending upon how the light beam is collimated in the optical approach, the relative sizes of the alignment mark and the reference mark are not as critical as in the case of resistance probing.

Figure 21:
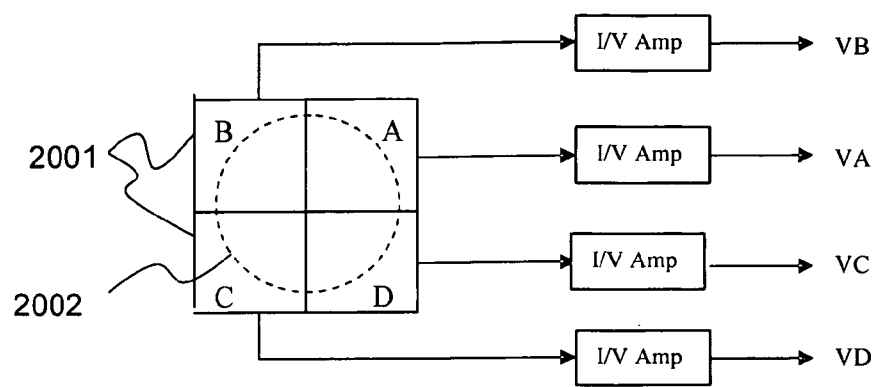
FIG. 21 is a simplified diagram of an optical setup with four photo-detectors and four I/V amplifiers for use in adjusting the deviation of displaced components.

FIG. 21 shows an example of an optical pickup containing a four-photo-detector probe and associated current-voltage (I/V) amplifiers for detecting the deviation of displaced components. Each I/V amplifier includes a current-voltage converter and a voltage amplifier. As light incidents on the photo-detector on a probe, a current is generated, which is then amplified by the I/V amplifier. A circular light beam 2002, reflected from a target reference is also shown. The reflected beam will be at the center of the optical pickup if the component is fully aligned to the reference target.

Four different voltages, VA, VB, VC, and VD, are generated by the optical pickup in FIG. 21. A set of comparators can be used to compare the voltage output from these I/V amplifiers. The direction of adjustment can be determined by comparing the output voltage of each I/V amplifier with a predetermined threshold voltage. A high output voltage detected by the comparator indicates the probe and the target reference has area overlap. A low output voltage detected by the comparator indicates the corresponding area is still misaligned. By shifting the component from the position where the comparator detects a high output voltage to the position where the comparator detects a low output voltage, the misalignment can be fixed. If none of the comparators detect a voltage level that exceeds a pre-determined threshold level (VT), i.e., no relevant reflection beam is detected by any of four photo-detectors, then the component is entirely misplaced or the optical probe is not in line with the target reference at all. The component is accurately aligned on the target platform if all four voltage levels reach the pre-determined threshold level.

Alignment Procedure

The alignment procedure to improve the accuracy in component placement is summarized as follows.

a. In preparation for component placement in assembly, some relevant information, such as the coordinates of the center of a land pattern or the coordinates of a reference mark associated with the land pattern on a target platform, the probe configuration, the size of an alignment mark on a component to be placed, and so on, are entered into the database of a placement system. The information is useful in the placement automation.

b. Load a target platform onto assembly equipment. A reference point on the target platform is chosen as the origin to match the origin of the coordinate system stored in the placement database.

c. The probe can be a single-sensor probe for monitoring the placement accuracy, or it can be a multiple-sensor probe for fixing the deviation of a displaced component. To fix the deviation of a component not accurately placed, the placement system needs to align the probe to the center of a target reference mark prior to placing a component on a target platform. The probe can be a resistance probe, which measures the on/off conduction from probe sensor, through an alignment mark, to a reference mark via a direct contact approach. The probe can be a capacitance probe, which detects the extent of area overlap between the probe and the target reference via a non-contact approach. The probe can also be an optical probe, which measures optical alignment between the probe and a target reference.

Aligning a probe to the center of a reference mark can be done by moving the probe to the coordinates of the reference mark per the information in the placement system database and adjusting the probe position, if necessary, until all sensors detecting current flow are the inner sensors around the center of the probe. For a resistance probe, the probe must be lowered down to make a direct contact with the reference mark. For a no-direct-contact capacitance probe, the probe needs to move to the range such that no foreign conduction object is within the range of its electrical field. For an optical probe, the probe needs to be height adjusted to have the light beam match the diameter of the target reference.

The inner sensors detecting current flow, based on the measurement through a reference mark, determine the range of active sensors on the probe. With proper adjustment the center of these active sensors can match the center of the reference mark automatically. The center and the range of active sensors on the probe are the new position and target for the alignment mark on the component to be aligned to. The multiple-sensor probe is able to provide feedback for component position adjustment, which is different from a single-sensor probe which can only detect the placement accuracy.

d. Pick up a component and place it at a target land pattern. The placement is based on the coordinates of the center of the target land pattern or the coordinates of the reference mark.

e. Adjust the component pickup header until the position of the component alignment mark is in line with the probe. The direction of adjustment is in the direction to make more active sensors detect current flows. The alignment is achieved when the alignment mark is in the position that all effective active sensors on probe can detect its presence.

Since the spatial relationship between the reference mark and the land pattern on the target platform can be pre-fabricated to match the spatial relationship between the component's alignment mark and its contact array, the component can then be well aligned to the target land pattern. Some minor out-of-specification components could be also used in assembly using such alignment technology.

f. For components with embedded indirect alignment paths, all indirect alignment paths can be connected in a daisy chain to form a serial alignment chain or several shorter alignment chains. The alignment chain can be used to detect the connection status for all components in the chain when the system is put in use.

The above sequence of steps illustrates a method according to an embodiment of the present invention. Other alternatives can also be provided where steps are added, one or more steps are removed, or one or more steps are provided in a different sequence without departing from the scope of the claims herein.

The alignment technique is not limited to the placement of components on PCBs in assembly. It can also be used in a variety of applications, such as the monitoring of the chip packaging, where the die to be mounted onto a substrate is viewed as the component and the substrate of the package is viewed as the target platform. Eventually, the alignment mark and probing technique can be applied to multiple package stacking, bare die stacking, multi-chip carrier module assembly, module assembly, encapsulated card assembly, motherboard assembly, and so on. One of ordinary skills in the art would recognize many variations, modifications, and alternatives.

The invention claimed is:

1. A method for assembling a multi-component electronic apparatus, the method comprising:
   providing a first component including:
      a first surface,
      a second surface, and
      at least one alignment mark at the second surface of the first component, the at least one alignment mark having a plurality of sensors; and
   providing a second component including:
      a first surface, and
      at least one reference mark at the first surface of the second component, wherein when the at least one reference mark is in a first position with respect to the plurality of sensors each of the plurality of sensors provides a conduction path through the at least one reference mark when terminated by an external probe and wherein the at least one reference mark is larger than each of the plurality of sensors.

2. The method of 1, comprising overlapping the reference mark with each of the plurality of sensors when the at least one reference mark is in the first position with respect to the plurality of sensors.

3. The method of claim 1, comprising coupling the conduction path to power or ground.

4. The method of claim 1, comprising terminating the conduction path at the first surface of the first component.

5. The method of claim 1, comprising terminating the conduction path at the first surface of the second component.

6. The method of claim 1, comprising terminating the conduction path at the first surface of the first component and at the first surface of the second component.

7. The method of claim 1, comprising coupling a current by the conduction path between the at least one reference mark and one of the plurality of sensors.

8. The method of claim 7, comprising connecting one of the plurality of sensors with the at least one reference mark wherein the current is a direct current.

9. The method of claim 1, comprising capacitively coupling one of the plurality of sensors with the at least one reference mark wherein the current is an alternating current.

10. The method of claim 1, comprising coupling by the conduction path an optical signal between the at least one reference mark and one of the plurality of sensors.

11. The method of claim 1, wherein the first component is a printed circuit board, a system mother board, an electronic substrate, a ceramic board, an integrated circuit bare die, a stacked integrated circuit die, a stacked integrated circuit chip, an integrated circuit encapsulated in a package, or an electronic device laminated with anisotropic conducting elastomer at a surface of one of the plurality of sensors.

12. The method of claim 1, wherein the second component is a printed circuit board, a system mother board, an electronic substrate, a ceramic board, an integrated circuit bare die, a stacked integrated circuit die, a stacked integrated circuit chip, an integrated circuit encapsulated in a package, or an electronic device laminated with anisotropic conducting elastomer at a surface of one of the plurality of sensors.

13. The method of claim 1, comprising:
   providing a plurality of interface contacts on the second surface of the first component, the at least one alignment mark having a spatial relationship to the plurality of interface contacts of the first component,
   providing a plurality of interface contacts on the first surface of the second component, the at least one reference mark having a spatial relationship to the plurality of interface contacts of the second component, and
   aligning the plurality of interface contacts of the first component to the plurality of interface contacts of the second component when the at least one reference mark is in the first position with respect to the plurality of sensors.

14. The method of claim 1, wherein a portion of the conduction path is within the first component, on the first surface of the first component, or on the second surface of the first component.

15. The method of claim 1, wherein the second component includes a second surface.

16. The method of claim 15, comprising terminating the conduction path at the first surface of the first component and at the second surface of the second component.

17. The method of claim 15, comprising terminating the conduction path at the first surface of the second component and at the second surface of the second component.

18. The method of claim 15, comprising terminating the conduction path at the second surface of the second component.

19. The method of claim 15, wherein a portion of the conduction path is within the second component, on the first surface of the second component, or on the second surface of the second component.

* * * * *